United States Patent [19]

Ujihara

[11] Patent Number: 4,978,844
[45] Date of Patent: Dec. 18, 1990

[54] OPTICAL ELEMENT CARRYING PRINTED SUBSTRATE AND OPTICAL HEAD DEVICE USING THE SUBSTRATE

[75] Inventor: Takashi Ujihara, Saitama, Japan

[73] Assignee: Pioneer Electronic Corporation, Tokyo, Japan

[21] Appl. No.: 426,347

[22] Filed: Oct. 25, 1989

[30] Foreign Application Priority Data

Jul. 31, 1986 [JP] Japan .................. 61-180965
Jul. 31, 1986 [JP] Japan .................. 61-180966

[51] Int. Cl.⁵ ........................... H01J 3/14; H01J 5/16
[52] U.S. Cl. .................... 250/216; 250/239; 369/112
[58] Field of Search ............... 250/216, 239, 201 DF, 250/201.4, 201.5; 369/43–46, 112; 350/247

[56] References Cited

U.S. PATENT DOCUMENTS

| | | | |
|---|---|---|---|
| 4,557,564 | 12/1985 | van Rosmalen | 350/247 |
| 4,644,516 | 2/1987 | Musha | 250/201 DF |
| 4,687,924 | 8/1987 | Galvin et al. | 250/239 |
| 4,709,139 | 11/1987 | Nakamura et al. | 250/201 DF |
| 4,792,674 | 12/1988 | Hirano | 250/239 |

Primary Examiner—David C. Nelms
Assistant Examiner—Stephone B. Allen
Attorney, Agent, or Firm—Sughrue, Mion, Zinn, Macpeak & Seas

[57] ABSTRACT

A component package for the semiconductor laser and photodiodes of an audio or video disk recording and/or playback system includes a wiring substrate which provides electrical wiring to these components and in addition provides support for the same. The substrate is configured to include independently flexible fingers or the like, with the laser and the photodiodes being supported by different fingers. The substrate is itself supported within a package body which is filled with a protective gas. This arrangement allows the electro-optical elements to be provided in chip form without independent protective cases.

6 Claims, 5 Drawing Sheets

OPTICAL ELEMENT CARRYING PRINTED SUBSTRATE AND OPTICAL HEAD DEVICE USING THE SUBSTRATE

This is a Division of application Ser. No. 07/390,581 filed August 4, 1989 which is a Continuation of application Ser. No. 07/080,290 filed July 31, 1987.

BACKGROUND OF THE INVENTION

1. Field of the Invention

The present invention relates to a printed substrate wiring device for connection to electrode-including optical elements such as photodiodes and semi-conductor lasers provided in chip form, and an optical head device using the same printed substrate.

2. Description of the Prior Art

In video disk and digital audio disk media, an information signal is recorded by forming a spiral track of pits corresponding to the information signal through the irradiation of the record surface of the disk with a fine spot of light. Further, in the case where the information signal thus recorded is to be reproduced, the original information signal is reproduced in accordance with the changes in the light reflected by or transmitted through the media upon irradiation of the track with a light source.

Various types of optical head devices for performing the aforementioned recording and reproducing functions have been developed. For example, these optical head devices include light-emitting elements, such as semiconductor lasers and the like; objective lenses for converging light emitted from the light-emitting elements onto the recording surface of the disk in the form of a spot; and light receiving elements, such as photodiodes or the like, for receiving light reflected from the recorded surface of the disk for generating a signal corresponding to the conditions of their light reception.

Referring to FIG. 6, there is shown a member used in a conventional optical head device, in which a semiconductor laser 51 in raw chip form is housed in an airtight package 55 constituted by a cylindrical portion 52, a glass plate 53 and a cover 54 and is connected to terminals 56 by wiring (not shown). The member together with other optical members, is attached to a body 57 as shown in FIG. 7. Referring to FIG. 8, there is shown another member used in the conventional optical head device, in which photodiodes 59 and 60 provided in chip form are sealed within a package 61 formed by a molded resin and are connected to terminals 62 by wiring (not shown). This member is also attached to the body 57 as shown in FIG. 7. The relative positions of the semiconductor laser and photodiodes are adjusted with high accuracy so that the laser light reflected from the recorded surface of the disk 64 is precisely incident upon the photodiodes 59 and 60.

In order to assemble the semiconductor laser 51 and photodiodes 59 and 60 while maintaining this predetermined relation in the relative positions thereof, conventionally, these elements are housed in their respective exclusive packages 55 and 61 and then the packages are attached to the body 57.

The semiconductor laser 51 and photodiodes 59 and 60 in themselves are very small parts, but the packages 55 and 61 surrounding them are relatively large. Accordingly, the body 57 supporting the packages also becomes a large member. This is a problem to be solved in the miniaturization of the optical head device.

Recently it has been considered that the semiconductor laser and photodiodes may be formed in the raw chip state and assembled without use of the aforementioned packages. However, it is difficult to assemble the semiconductor laser and photodiodes while positioning them with high accuracy, because they are very small in size as described above.

Where the relative positions of the semiconductor laser and diode are to be adjusted, this is done by observing the light reception condition of the photodiode due to the light emitted from the semiconductor laser. Toward this end, electrical power is supplied to the wiring attached to the two parts, with the wiring arranged in a manner such that the relative positions of the two parts can be changed on the basis of the results of the measurement. However, it is particularly difficult to form the complex wiring so that the positions of the small-scale semiconductor laser and diodes can be suitably changed. Accordingly, the development of wiring to make this task easy has been desired.

SUMMARY OF THE INVENTION

It is therefore an object of the present invention to solve the aforementioned problem.

It is another object of the present invention to provide a wiring member which may be connected to the electrodes of small electrode-including optical elements provided in chip form, which member is simple in its construction and enables easy adjustment of the position of the optical elements relative to their support members.

It is a further object of the present invention to provide an optical head device of smaller scale than the prior arrangements.

In order to attain the above objects, according to an aspect of the present invention, a printed substrate acting as a wiring member is connected to the electrodes of the optical elements, the printed substrate having carrier positions for carrying the optical elements, the carrier portions being formed so as to be flexible independently of each other.

According to another aspect of the present invention, the optical head device is arranged such that a light-emitting element and a light-receiving element in chip form are disposed within the interior space of a common package constituted of a package body and a cover, so that, for example, the elements are airtightly housed in the common package together with a protection gas.

BRIEF DESCRIPTION OF THE DRAWINGS

The above and other objects, features and advantages of the present invention will appear more fully from the following description in conjunction with the accompanying drawings, in which.

DETAILED DESCRIPTION OF THE PREFERRED EMBODIMENTS

An optical head device including an optical element-carrying printed substrate will be described in detail with reference to the accompanying drawings, as an embodiment of the present invention.

Figure 1:
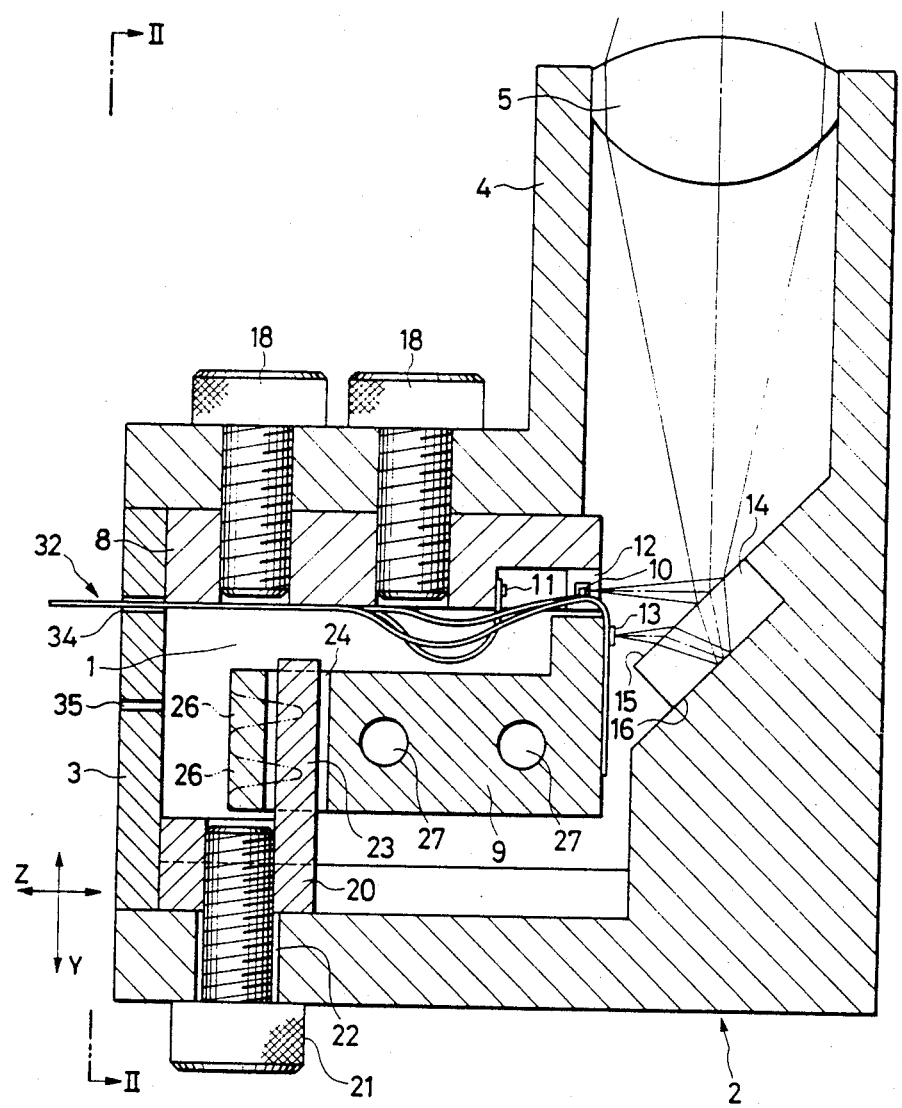
FIG. 1 is a longitudinal sectional view of the important parts of an optical head device according to the present invention.
Figure 2:
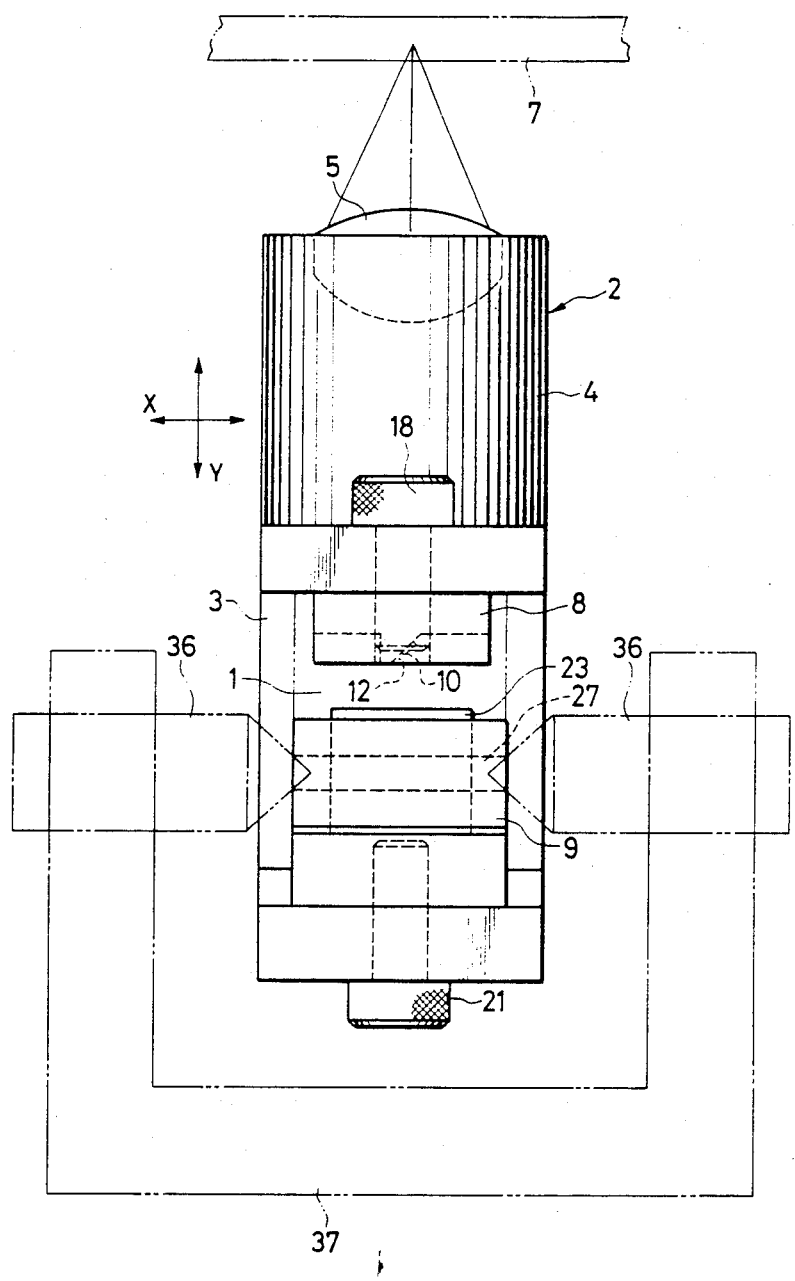
FIG. 2 is a side view taken along the line II—II of FIG. 1.
Figure 3:
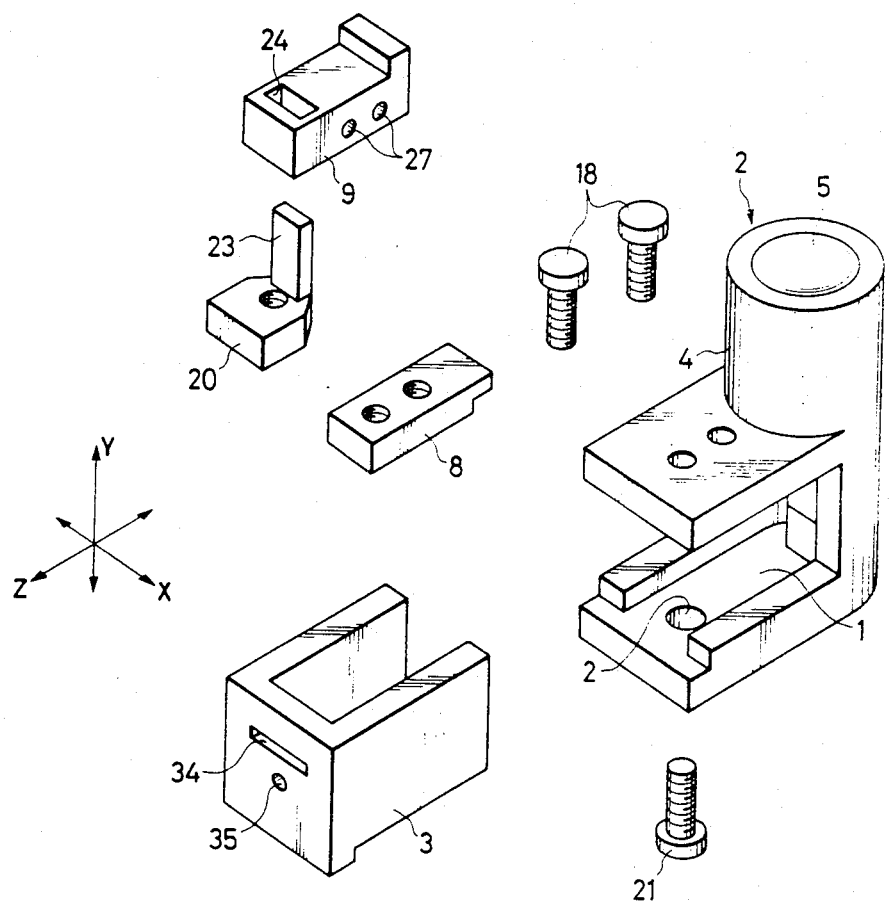
FIG. 3 is an exploded perspective view of the major elements.
Figure 4:
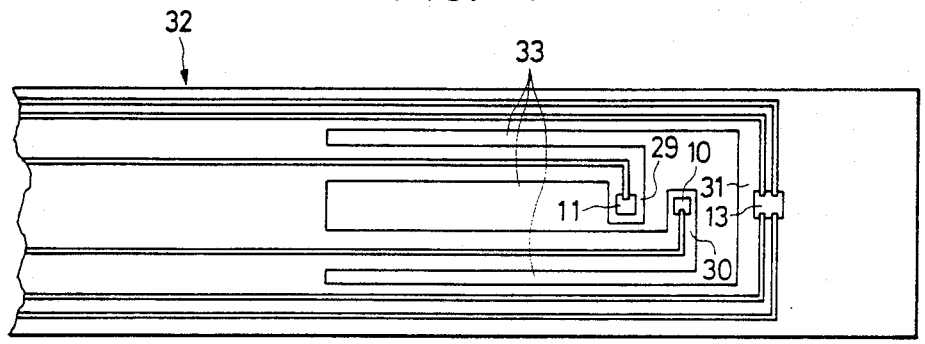
FIGS. 4 and 5(a) to 5(c) are views showing a printed substrate according to the present invention.
Figure 5A:
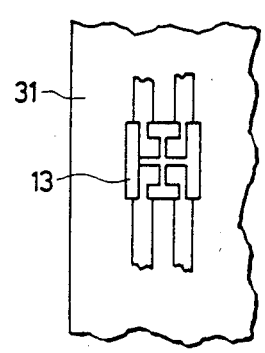
Figure 5B:
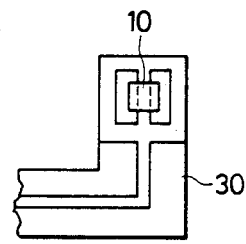
Figure 5C:
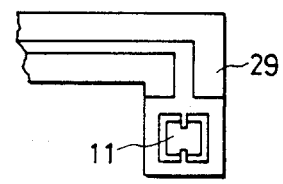
Figure 6:
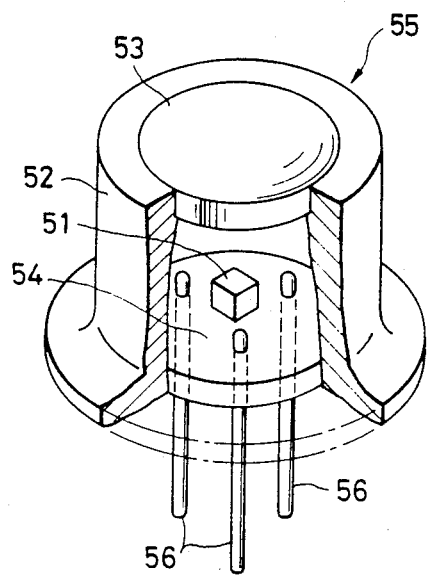
FIGS. 6, 7 and 8 are views for explaining the conventional optical head device.
Figure 8:
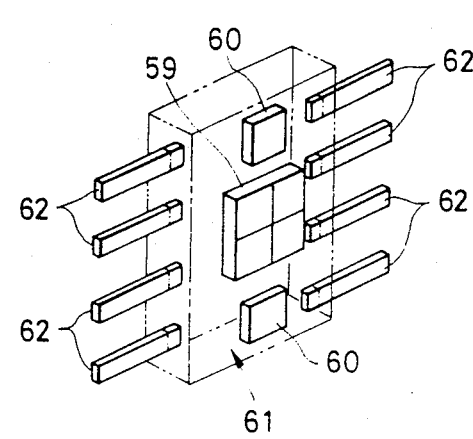
Figure 7:
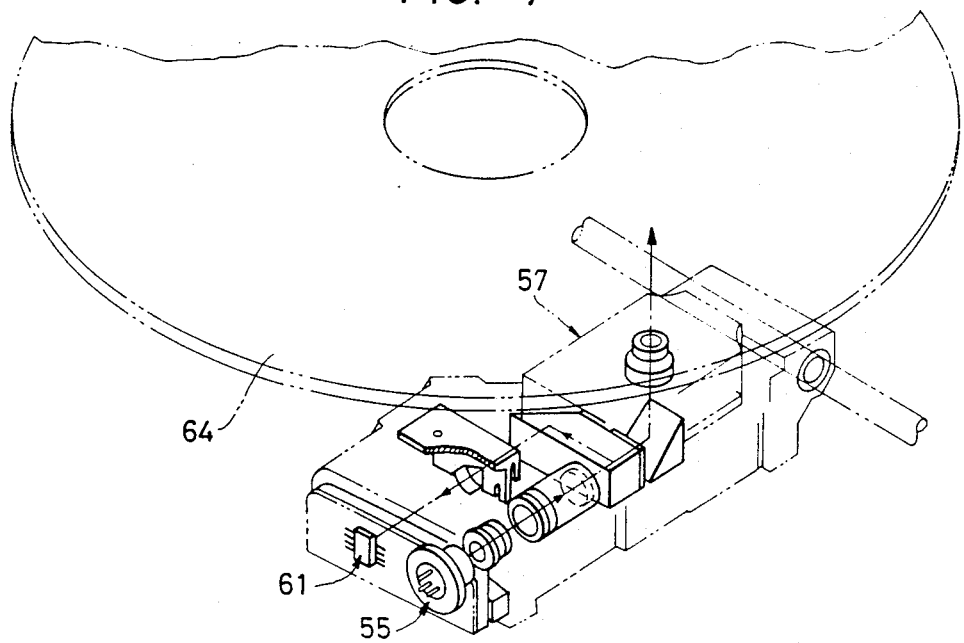

As shown in FIGS. 1 to 3, the optical head device has a package body 2 provided with an interior volume or space 1, and a cover 3 for closing the opening of the interior space 1. A cylindrical portion 4 is formed at the upper end of the package body 2, and an objective lens 5 is provided at the upper end of the cylindrical portion 4. As shown in FIG. 2, the objective lens 5 converges light emitted from a semiconductor laser (which will be described later) onto the recording surface of a disk 7.

Two holders 8 and 9 are disposed within the interior space 1 of the package body 2. A semiconductor laser 10 and a monitor photodiode 11 are attached to the holder 8. More specifically, the semiconductor laser 10 is attached to an oblique portion 12 formed on the holder 8 so that it is inclined at 45 degrees relative to the light path. A quartering photodiode 13 is attached to the other holder 9. The semiconductor laser 10, the monitor photodiode 11 and the quartering photodiode 13 are formed as raw chip elements and are protected by nitrogen gas injected into the space 1. The quartering photodiode 13 receives light reflected from the recorded surface of the disk 7 to generate a signal corresponding to the transmissivity or reflectivity of the disk. The monitor photodiode 11 detects a change in the output of the semiconductor laser 10, especially a change in output due to temperature, to perform feedback control of the output.

A parallel-plane plate 14 is disposed in the vicinity of the quartering photodiode 13 and is fixed to the inner wall of the package body 2.

The light path in the optical head device and the functions of the respective optical elements will now be briefly described.

Light emitted from the semiconductor laser 10 is reflected by a semitransparent mirror plane 15 of the parallel-plane plate 14 and is then converged by the objective lens 5 to form a beam incident on the recorded surface of the disk 7. Light reflected from the surface of the disk 7 owing to the incident light is converged by the objective lens 5, passed through the semitransparent mirror plane 15 of the parallel-plane plate 14 and reflected by a reflection plane 16. The parallel-plane plate 14 is arranged so that the incident plane (semitransparent mirror plane 15) is inclined relative to the axis of the light reflected from the disk 7. Accordingly, the parallel-plane plate 14 imparts an astigmatism to the light passed through the semitransparent mirror plane. The reflected light to which astigmatism is given by the parallel-plane plate 14 enters the quartering photodiode 13. By the astigmatism imparted to the reflected light, the form of the reflected light imaged on the light-receiving surface of the quartering photodiode 13 is changed corresponding to the positional relation between the recorded surface of the disk 7 and the convergent bundle of light incident on the disk 7. In order to detect a change in the shape of the reflected light, the quartering photodiode 13 is arranged so as to be divided into four elements by two lines perpendicularly intersecting each other. The light-receiving surface of the quartering photodiode 13 is formed by the four independent elements so formed and is arranged so as to be located at a place where the reflected light is circularly shaped when focused (i.e., when the focus error is zero). The difference between two measured values calculated by adding the measured value at each element to that of an opposite element with respect to the center of the light-receiving surface of the quartering photodiode 13 is taken as a focus error signal. In accordance with the focus error signal, the whole of the arrangement shown in FIG. 1 is servo-driven in two directions, that is, in the direction of the optical axis of the objective lens 5 and in the direction perpendicular thereto.

In the following, the arrangement for adjusting the relative positions of the semiconductor laser 10 and the quartering photodiode 13 is described.

As shown in FIGS. 1 to 3, the holder 8 holding both the monitor photodiode 11 and the semiconductor laser 10 is directly tightly fixed to the package body 2 by two screws 18. On the other hand, the holder 9 holding the quartering photodiode 13 is attached to the package body 2 through an intermediate member 20 by a screw 21. The screw 21 is loosely received with a predetermined clearance into a round hole 22 formed in the lower end of the package body 2, and the top end of the screw 21 is screwed into the intermediate member 20. It is apparent from FIG. 3 that the intermediate member 20 is provided with a linearly extending rectangular-pillar-like projection 23. After the projection 23 is fit with a predetermined clearance into a rectangular hole 24 formed in the holder 9, the holder 9 and the intermediate member 20 are fused to each other by laser irradiation at a portion designated by the reference numeral 26 in FIG. 1. Thus, the holder 9 is fixed to the intermediate member 20. A pair of throughholes 27 are formed in the holder 9 so as to be engaged by an adjustment jig which will be described later.

As shown in FIGS. 1, 4 and 5(a) to 5(c), a printed substrate 32 has carrier portions 29, 30 and 31 for carrying the semiconductor laser 10, the monitor photodiode 11 and the quartering photodiode 13, and the respective electrodes of the semiconductor laser 10, the monitor photodiode 11 and the quartering photodiode 13 are connected to the carrier portions 29, 30 and 31 respectively, so that the semiconductor laser 10, the monitor photodiode 11 and the quartering photodiode 13 are attached to the holders 8 and 9 through the printed substrate 32. It is apparent from FIG. 4 that the carrier portions 29, 30 and 31 carrying the semiconductor laser 10, the monitor photodiode 11 and the quartering photodiode 13 are partially separated from each other by the openings 33 and are formed so as to be flexible independent of each other.

As shown in FIG. 1, an end of the substrate 32 is drawn out through a slit 34 formed in the cover 3. The aforementioned nitrogen gas acting as a protection gas is injected into the space 1 through a fine hole 35 formed under the slit 35. Upon completion of the injection of the nitrogen gas; the fine port 35 is closed.

In the following, the adjustment of the relative positions of the semiconductor laser 10 and the quartering photodiode 13 is described. In this case, the semiconductor laser 10 is fixed and the adjustment of the relative position is made by moving the quartering photodiode 13. The semiconductor laser 10, the monitor photodiode 11 and the quartering photodiode 13 are preliminarily heat-pressure welded onto the carrier portions 29, 30 and 31 of the printed substrate 31 and are fixed to the holders 8 and 9 with an adhesive while suitably bending the respective carrier portions.

First, as shown in FIG. 2, an adjustment jig constituted by a pair of pointed-head pins 36 and a frame 37 is prepared and the pins 36 are engaged with the through-holes 27 of the holder 9. The adjustment jig is driven in the X, Y and Z directions by precision movement means such as a robot hand.

In this condition the semiconductor 10 is energized to emit light. The light reception condition of the quartering photodiode 13 is measured by a predetermined measurement instrument, and the relative positions of the elements are adjusted by moving the holder 9, and hence the quartering photodiode 13, until the measured values reach that desired. The movement in the Z-direction is carried out by means of the clearance between the screw 21 and the round hole 22 of the package body 2. The movement in the X- and Y-directions is carried out by means of the movement through the clearance between the rectangular hole 24 of the holder 9 and the rectangular-pillar-like projection 23 of the intermediate member 20. After the relative positions of the semiconductor laser 10 and the quartering photodiode 13 are determined as described above, the holder 9 and the intermediate member 20 are welded to each other by laser irradiation on a portion designated by the reference numeral 26 in FIG. 1. Then, the screw 21 is strongly tightened. After the adjustment of the relative positions is thus perfected, the adjustment jig is taken off.

As described in detail above, the wiring member according to the present invention comprises a printed substrate (32) which is connected to the electrodes of fine optical elements (semiconductor laser 10, monitor photodiode 11 and quartering photodiode 13) and which has carrier positions (29, 30 and 31) for carrying the optical elements, the carrier portions being formed as separated fingers or the like of the substrate, so as to be flexible independently of each other.

The complex wiring to the fine optical elements can be made very simple when such a printed substrate is used as the wiring member, and the positional adjustment of the optical elements relative to the support member for supporting the optical elements can be made easily because of the independent flexibility of the carrier portions.

In the optical head device according to the present invention, both parts, that is, the light-emitting element (semiconductor laser 10) and the light-receiving element (quartering photodiode 13) are provided as raw chips and are disposed within the interior space of a common package constituted of a package body (2) and a cover (3), so that for example, the parts are airtightly housed in the common package, which is filled with a protection gas. The package need not be incorporated into a body (57) which is far larger than the package and which has been used in the conventional optical head device. In short the package also functions as the body. Accordingly, the optical head device can be remarkably reduced in size as a whole.

I claim:

1. An optical head device, comprising; a light-emitting element, an objective lens for converging light emitted from said light-emitting element onto a surface of an optical information recording medium, a light-receiving element for receiving light reflected from said surface and for generating an electrical signal in response thereto, and a holder mechanism for holding said light-emitting element and said light-receiving element, said holding mechanism including a package body provided with a partly open interior space and a cover for closing an opening portion of said interior space, said light-emitting element and said light receiving element being disposed within said interior space.

2. An optical head device according to claim 1, in which said package body further comprises means for supporting said objective lens.

3. An optical head device according to claim 1, wherein said interior space is filled with a protective gas.

4. An optical head device according to claim 1, further including means for varying relative positions of said light receiving element.

5. An optical head device according to claim 1, further including means for supporting said independent flexible portions comprising at least one positionally adjustable support element connectible to said package body.

6. An optical head device according claim 1, wherein said light receiving element and said light emitting element are provided in chip form and are packaged only by said package body.

* * * * *